(12) United States Patent
Perner et al.

(10) Patent No.: US 6,980,466 B2
(45) Date of Patent: Dec. 27, 2005

(54) SOFT-REFERENCE FOUR CONDUCTOR MAGNETIC MEMORY STORAGE DEVICE

(75) Inventors: Fredrick A. Perner, Palo Alto, CA (US); Manish Sharma, Sunnyvale, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 151 days.

(21) Appl. No.: 10/758,658

(22) Filed: Jan. 15, 2004

(65) Prior Publication Data

US 2005/0157540 A1    Jul. 21, 2005

(51) Int. Cl.$^7$ .............................................. G11C 11/02
(52) U.S. Cl. ........................ 365/158; 365/157; 365/173
(58) Field of Search ................................ 365/158, 157, 365/171, 173

(56) References Cited

U.S. PATENT DOCUMENTS

| | | | |
|---|---|---|---|
| 5,039,656 A * | 8/1991 | Hidaka ........................ 505/171 |
| 5,793,697 A * | 8/1998 | Scheuerlein ........... 365/230.07 |
| 6,331,944 B1 * | 12/2001 | Monsma et al. ............ 365/171 |
| 6,385,082 B1 | 5/2002 | Abraham et al. |
| 6,404,647 B1 | 6/2002 | Anthony et al |
| 6,404,673 B1 * | 6/2002 | Matsui ........................ 365/173 |
| 6,498,092 B2 | 12/2002 | Lee et al. |
| 6,538,917 B1 | 3/2003 | Tran et al. |
| 6,538,920 B2 | 3/2003 | Sharma et al. |

* cited by examiner

Primary Examiner—Tan T. Nguyen (57) ABSTRACT

This invention provides a soft-reference four conductor magnetic memory storage device. In a particular embodiment, there are a plurality of parallel electrically conductive first sense conductors and a plurality of parallel electrically conductive second sense conductors. The first and second sense conductors may provide a cross point array or a series connected array. Soft-reference magnetic memory cells are provided in electrical contact with and located and at each intersection. In addition there are a plurality of parallel electrically conductive write rows substantially proximate to and electrically isolated from the first sense conductors. A plurality of parallel electrically conductive write columns transverse to the write rows, substantially proximate to and electrically isolated from the second sense conductors, forming a write cross point array with a plurality of intersections, is also provided. Sense magnetic fields generated by at least one conductor orient the soft-reference layer but do not alter the data stored within the cell. An associated method of use is also provided.

42 Claims, 8 Drawing Sheets

SOFT-REFERENCE FOUR CONDUCTOR MAGNETIC MEMORY STORAGE DEVICE

FIELD OF THE INVENTION

This invention relates generally to magnetic memory devices and in particular to soft-reference layer magnetic random access memory (commonly referred to as "MRAM") in a four conductor architecture.

BACKGROUND OF THE INVENTION

Today's computer systems are becoming increasingly sophisticated, permitting users to perform an ever increasing variety of computing tasks at faster and faster rates. The size of the memory and the speed at which it can be accessed bear heavily upon the overall speed of the computer system.

Generally, the principle underlying the storage of data in magnetic media (main or mass storage) is the ability to change and/or reverse the relative orientation of the magnetization of a storage data bit (i.e. the logic state of a "0" or a "1"). The coercivity of a material is the level of demagnetizing force that must be applied to a magnetic particle to reduce and/or reverse the magnetization of the particle. Generally speaking, the smaller the magnetic particle, the higher it's coercivity.

Figure 1A:
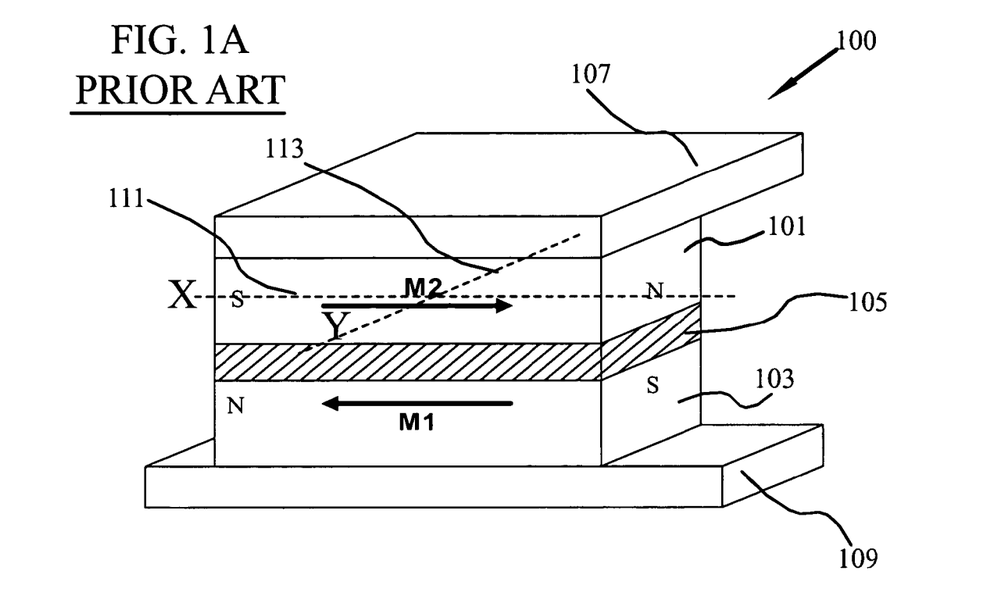
FIGS. 1A–1B show perspective views of a prior art magnetic memory cell having two conductors.
Figure 1B:
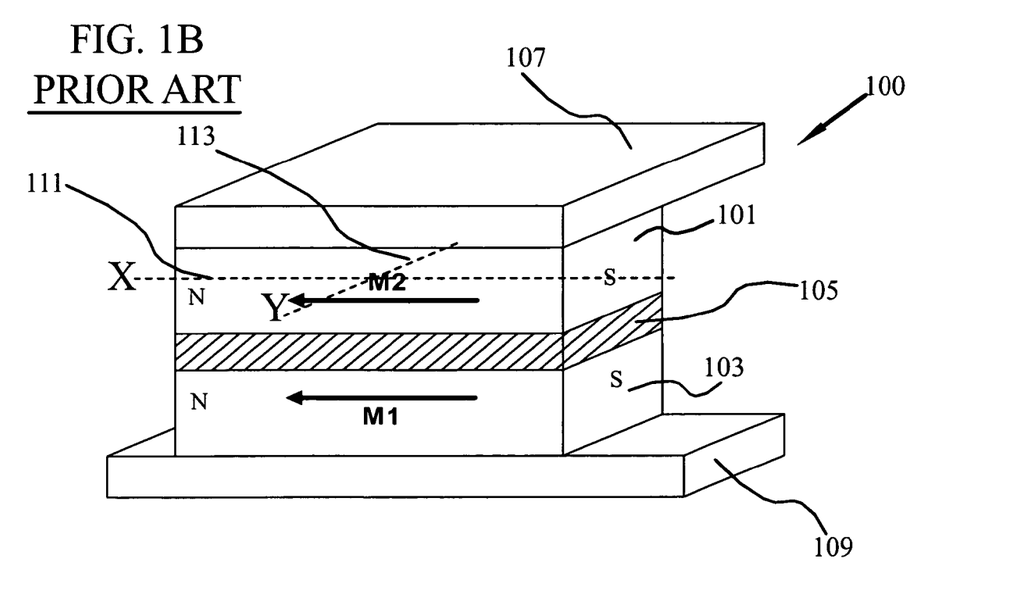

A prior art magnetic memory cell may be a tunneling magneto-resistance memory cell (TMR), a giant magneto-resistance memory cell (GMR), or a colossal magneto-resistance memory cell (CMR). These types of magnetic memory are commonly referred to as magnetic tunnel junction memory (MTJ). FIGS. 1A and 1B provide a perspective view of a typical prior art magnetic memory cell having two conductors. As shown in prior art FIGS. 1A and 1B, a magnetic tunnel junction memory 100 generally includes a data layer 101 (also called a storage layer or bit layer), a reference layer 103, and an intermediate layer 105 between the data layer 101 and the reference layer 103. The data layer 101, the reference layer 103, and the intermediate layer 105 can be made from one or more layers of material. Electrical current and magnetic fields may be provided to the MTJ 100 by an electrically conductive row conductor 107 and an electrically conductive column conductor 109. Often the row and column conductors are substantially transverse.

The data layer 101 is usually a layer of magnetic material that stores a bit of data as an orientation of magnetization M2 that may be altered in response to the application of an external magnetic field or fields. More specifically, the orientation of magnetization M2 of the data layer 101 representing the logic state can be rotated (switched) from a first orientation, representing a logic state of "0", to a second orientation, representing a logic state of "1", and/or vice versa.

The reference layer 103 is usually a layer of magnetic material in which an orientation of magnetization M1 is "pinned", as in fixed, in a predetermined direction. The direction is predetermined and established by microelectronic processing steps employed in the fabrication of the magnetic memory cell.

The data layer 101 and reference layer 103 may be thought of as stacked bar magnets, each long on the X axis 111 and short on the Y axis 113. The magnetization of each layer has a strong preference to align along the easy axis, generally the long X axis 111. The short Y axis 113 is generally the hard axis. As with traditional bar magnets, the data layer and reference layer each have magnetic poles, one at either end of the easy axis. The lines of magnetic force that surround the data layer and reference layers are three-dimensional and flow from the North to the South pole.

Typically, the logic state (a "0" or a "1") of a magnetic memory cell depends on the relative orientations of magnetization in the data layer 101 and the reference layer 103. For example, when an electrical potential bias is applied across the data layer 101 and the reference layer 103 in an MTJ 100, electrons migrate between the data layer 101 and the reference layer 103 through the intermediate layer 105. The intermediate layer 105 is typically a thin dielectric layer commonly referred to as a tunnel barrier layer. The phenomena that cause the migration of electrons through the barrier layer may be referred to as quantum mechanical tunneling or spin tunneling.

Continuing with the model of an elemental bar magnet, the magnetization of the data layer 101 is free to rotate, but has a strong preference to align in either direction along the easy axis 111 of the data layer 101. The reference layer 103 likewise is aligned along the easy axis 111 but is pinned in a fixed alignment such that it does not freely rotate. The logic state may be determined by measuring the resistance of the memory cell. For example, if the overall orientation of the magnetization in the data layer 101 is parallel to the pinned orientation of magnetization in the reference layer 103 the magnetic memory cell will be in a state of low resistance. If the overall orientation of the magnetization in the data layer 101 is anti-parallel (opposite) to the pinned orientation of magnetization in the reference layer 103, the magnetic memory cell will be in a state of high resistance.

In an ideal setting, the orientation of the alterable magnetic field in the data layer 101 would be either parallel or anti-parallel with respect to the field of the reference layer 103. As both the data layer 101 and the reference layer 103 are generally made from ferromagnetic materials and are positioned in close permanent proximity to each other, the generally stronger reference layer 103 may affect the orientation of the data layer 101. More specifically, the magnetization of the reference layer 103 may generate a demagnetization field that extends from the reference layer 103 into the data layer 101.

The result of this demagnetization field from the reference layer 103 is an offset in the coercive switching field. This offset can result in asymmetry in the switching characteristics of the bit: the amount of switching field needed to switch the bit from parallel to anti-parallel state is different from the amount of switching field needed to switch the bit from anti-parallel state to parallel state. To achieve reliable switching characteristics and to simplify the read/write circuitry, it is desirable to reduce this offset to as near zero as possible.

The magneto-resistance $\Delta R/R$ may be described as akin to a signal-to-noise ratio S/N. A higher S/N results in a stronger signal that can be sensed to determine the state of the bit in the data layer. Thus, at least one disadvantage of a tunnel junction memory cell having a pinned reference layer in close and fixed proximity to the data layer is a potential reduction in the magneto-resistance $\Delta R/R$ resulting from the angular displacement.

To pin the reference layer during manufacturing, the reference layer must be heated to an elevated temperature in an annealing step. The annealing step typically takes time, perhaps an hour or more. As the reference layer is but one part of the memory being produced, the entire memory is typically subjected to temperatures ranging from about 200 to 300 degrees centigrade while under the influence of a constant and focused magnetic field. Such manufacturing stresses may cause the reference layer to become un-pinned and lose its set orientation if the memory is later subjected to high temperatures. In addition, the characteristics of the data layer may be unknowingly affected by heat during some manufacturing processes.

Although effective, the process of reading the stored bit is somewhat undesirable. In general, the row 107 and column 109 for a given MTJ 100 are selected, a sense current is applied and the resistance is measured and recorded as the initial condition. Next, a larger write current is applied to put the data layer 101 into a known orientation. Then, a sense current is re-applied and the resistance is measured again. The value determined from a known orientation is then compared with the value from the initial condition. The values will either be the same or different, permitting a determination of the data value. If necessary, such as where the initial position is determined to be opposite to the known orientation, a write back can be performed to restore the original initial value. This process is known as double sampling—the first sample being the initial read and the second being after the known orientation write.

Multiple variations of redundant sampling may be performed with double sampling; however, the underlying negative aspect remains unchanged—to determine the value stored in the data layer 101, it is necessary to change the value in the data layer 101. Such change introduces a significant element of risk in data corruption should an error occur during the repetitive sense and write operations.

Although sense operations are less demanding and taxing upon the MTJ 100, the physical design of the MTJ 100 is typically dictated by the stresses imposed by the write process, as both the sense and write operations are performed using the same row and column conductors 107 and 109. As the write magnetic field is typically generated by current applied to the row 107 and column 109 conductors, which are in electrical contact with the MTJ 100, it is desirable for the MTJ 100 to be robust enough to withstand the applied current. Design and manufacturing issues are therefore generally focused upon the requirements imposed by the write operation, such as greater electrical current and magnetic fields, higher applied voltages, more robust characteristics in the power supply, row 107 and column 109 conductors and appropriate buffering spaces.

With respect to magnetic memory components, it is well known that as size decreases, coercivity increases. A large coercivity is generally undesirable, as it requires a greater magnetic field to be switched, which in turn requires a greater power source and potentially larger switching transistors. Providing large power sources and large switching transistors is generally at odds with the focus of nanotechnology to reduce the necessary size of components. In addition, to mitigate the potential of inadvertently switching a neighboring memory cell, nanometer scaled memory cells are generally more widely spaced relative to their overall size than are larger, non-nanometer sized memory cells. Moreover, as the size of the magnetic memory decreases, the unused space between individual memory cells tends to increase.

Moreover, in a typical MRAM array, a significant amount of overall space may be used simply to provide a physical buffer between the cells. Eliminating this buffering space, or otherwise reducing its ratio, may provide a greater volume of storage in the same physical space.

These issues of read vs. write currents, robustness of conductors and power supplies, reduction in size increasing coercivity and a correspondingly greater magnetic field, and current design of the magnetic memory cells also carry over into the design and use of magnetic field sensors. Magnetic field sensors are commonly used in hard drive read cells and read heads. In such implementation, the data layer 101 is termed a sense layer and is oriented by the magnetic field emanating from a storage bit proximate to the read head.

Hence, there is a need for an ultra-high density magnetic memory which overcomes one or more of the drawbacks identified above. The present invention accomplishes this objective, among others.

SUMMARY OF THE INVENTION

The invention provides a soft-reference four conductor magnetic memory storage device.

In particular, and by way of example only, according to an embodiment of the present invention, this invention provides a soft-reference four conductor magnetic memory storage device including: a plurality of parallel electrically conductive first sense conductors; a plurality of parallel electrically conductive second sense conductors crossing the first sense conductors, thereby forming a sense cross point array with a plurality of intersections; a plurality of soft-reference magnetic tunnel junction memory cells, each cell in electrical contact with and located at an intersection between a first sense conductor and a second sense conductor, the memory cells including a material with an alterable orientation of magnetization; a plurality of parallel electrically conductive write rows substantially proximate to and electrically isolated from the first sense conductors; and a plurality of parallel electrically conductive write columns crossing the write rows, substantially proximate to and electrically isolated from the second sense conductors, thereby forming a write cross point array with a plurality of intersections.

Moreover, according to an embodiment thereof, the invention may provide a soft-reference four conductor magnetic memory cell including: at least one ferromagnetic data layer characterized by an alterable orientation of magnetization; an intermediate layer in contact with the data layer; at least one ferromagnetic soft-reference layer in contact with the intermediate layer, opposite from the data layer, the soft-reference layer having a non-pinned orientation of magnetization and lower coercivity than the data layer; at least one first sense conductor in electrical contact with the soft-reference layer, opposite from the intermediate layer; at least one second sense conductor in electrical contact with the data layer, opposite from the intermediate layer; at least one write column conductor substantially proximate to and electrically isolated from the second sense conductor; and at least one write row conductor substantially proximate to and electrically isolated from the first sense conductor.

In yet another embodiment, the invention may provide a method of non-destructively determining a data value in a magnetic memory storage device having a plurality of soft-reference four conductor magnetic memory cells, each cell including a soft-reference layer, a set of sense conductors in electrical contact with the cell, and a set of write conductors electrically isolated from the cell, the method including: selecting a given magnetic memory cell; providing an initial sense current to at least one sense conductor; generating an initial sense magnetic field proximate to the given memory cell; pinning-on-the-fly the soft-reference layer in orientation with the initial sense magnetic field; measuring an initial resistance value of the given cell; storing the initial resistance value; generating a second known sense magnetic field proximate to the given memory cell and orienting the soft-reference layer in a second known orientation; measuring a second resistance value of the given cell with the soft-reference in the second known orientation; storing the second resistance value as a reference resistance; comparing the initial resistance value to the reference resistance value; and returning a logic level associated with the compared state.

These and other features and advantages of the preferred apparatus and method will become apparent from the following detailed description taken in conjunction with the accompanying drawings which illustrate, by way of example, the principles of the invention.

BRIEF DESCRIPTION OF THE DRAWINGS

FIGS 5A–7B show partial perspective views of the memory of FIGS. 2A and 2B with respect to the generated sense magnetic fields;

DETAILED DESCRIPTION

Before proceeding with the detailed description, it is to be appreciated that the present invention is not limited to use or application in conjunction with a specific type of computer system, operating system or non-volatile memory, main or secondary. Thus, although the present invention is, for the convenience of explanation, depicted and described with respect to typical exemplary embodiments, it will be appreciated that this invention may be applied with other types of computer systems, operating system and non-volatile memory.

Figure 2A:
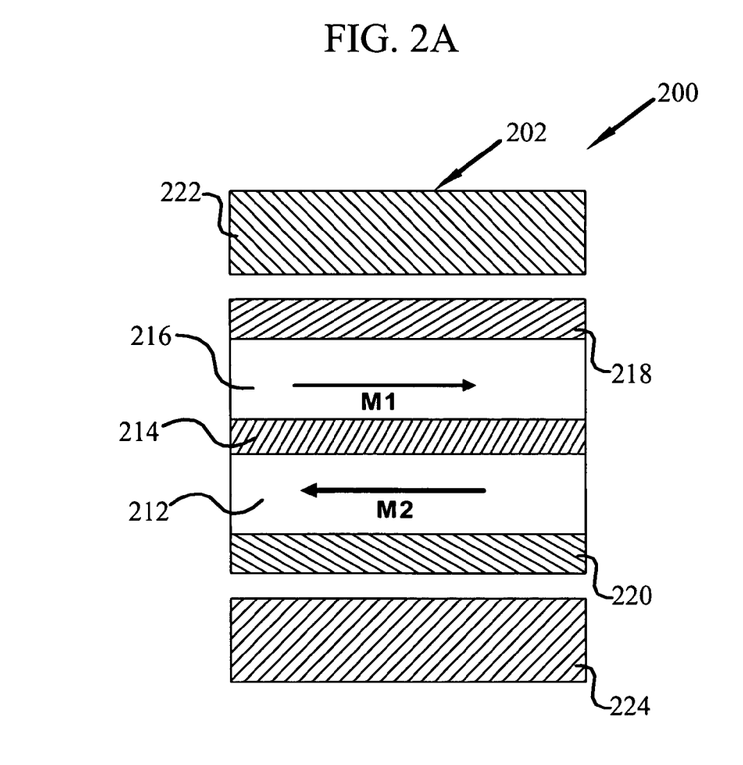
FIG. 2A provides plain view of a soft-reference four conductor magnetic memory according to a preferred embodiment of the present invention.

Referring now to the drawings, and more particularly to FIG. 2A, there is shown a portion of a magnetic memory 200 having at least one soft-reference memory cell 202 and four conductors, according to an embodiment of the present invention. In at least one embodiment, the magnetic memory cell 202 is a soft-reference magnetic memory tunnel junction (MTJ) memory cell having at least one first sense conductor 218, at least one second sense conductor 220, at least one write row conductor 222, and at least one write column conductor 224.

The soft-reference magnetic memory cell 202 itself, has a ferromagnetic data layer 212, an intermediate layer 214 and a ferromagnetic soft-reference layer 216. The ferromagnetic data layer 212 permits the storing of a bit of data as an alterable orientation of magnetization M2. The intermediate layer 214 has opposing sides such that the data layer 212 in contact with one side is in direct alignment with, and substantially uniformly spaced from, the soft-reference layer 216, in contact with the second side of the intermediate layer 214. The soft-reference layer 216 is characterized by a non-pinned orientation of magnetization M1 and a lower coercivity than the data layer 212.

The ferromagnetic data layer 212 and the soft-reference layer 216 may be made from a material that includes, but it not limited to: Nickel Iron (NiFe), Nickel Iron Cobalt (NiFeCo), Cobalt Iron (CoFe), and alloys of such metals. In addition, both the soft-reference layer 216 and the data layer 212 may be formed from multiple layers of materials. However, for conceptual simplicity and ease of discussion, each layer component is herein discussed as a single layer.

As shown, at least one first sense conductor 218 is in electrical contact with the soft-reference layer 216, opposite from the intermediate layer 214. At least one second sense conductor 220 is in electrical contact with the data layer 212 opposite from the intermediate layer 214. In addition, the magnetic memory 200 has at least one write row conductor 222 substantially proximate to and electrically isolated from the first sense conductor 218, and at least one write column conductor 224 substantially proximate to and electrically isolated from the second sense conductor 220.

Figure 2B:
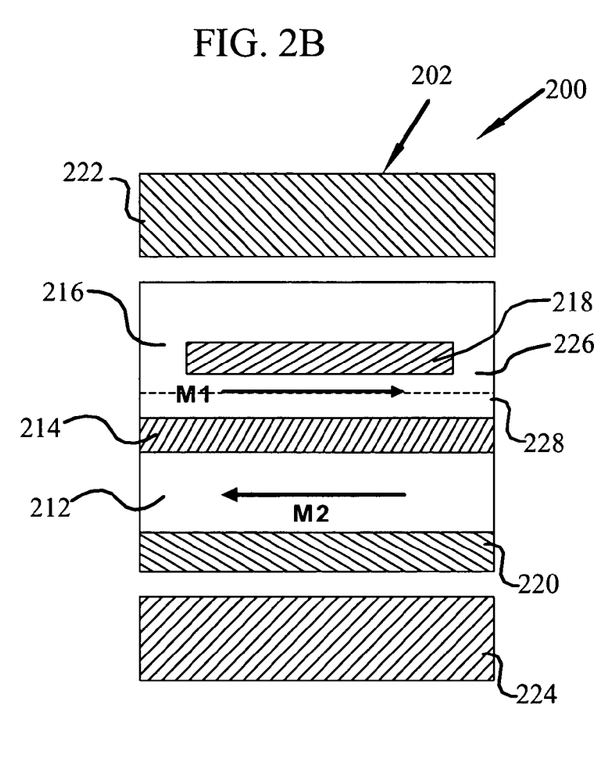
FIG. 2B provides a plain view of a soft-reference four conductor magnetic memory according to an alternative preferred embodiment of the present invention.

In at least one alternative embodiment shown in FIG. 2B, the soft-reference layer 216 comprises the first sense conductor 218 and a ferromagnetic cladding 226 that completely surrounds the first sense conductor to form a ferromagnetic clad first sense conductor 218, herein referred to as a cladded first sense conductor. An intermediate layer 214 is in contact with the soft-reference layer 216. At least one ferromagnetic data layer 212 is in contact with the intermediate layer opposite from the soft-reference layer. A second sense conductor 220 is in contact with the data layer 212, opposite from the intermediate layer 214. At least one write column conductor 224 is substantially proximate to and electrically isolated from the second sense conductor. At least one write row conductor 222 is substantially proximate to and electrically isolated from the soft-reference layer 216, opposite from the write column conductor 224.

Under appropriate circumstances in fabrication, a ferromagnetic cap 228 consisting of substantially the same material as the cladding 226 may be in contact with the intermediate layer 214. When a cap 228 is provided, the cladding 226 of the first sense conductor 218 and the cap 228 function substantially as a unified whole. Specifically, the cap 228 is optional. In at least one embodiment, a separate cap 228 is not provided and the cladding 226 is in direct contact with the intermediate layer 214.

Furthermore, the cladding 226 has a tailored thickness that includes a thinner portion along a portion of the cladding that is in contact with the intermediate layer 214, or cap 228, if present. The cladding 226 has a thicker portion along those portions of the cladding that are not in contact with the intermediate layer 214 or cap 228, if present. The cladding 226 serves to substantially contain the magnetic field generated by the first sense conductor 218, as will be more fully discussed below.

Figure 3A:
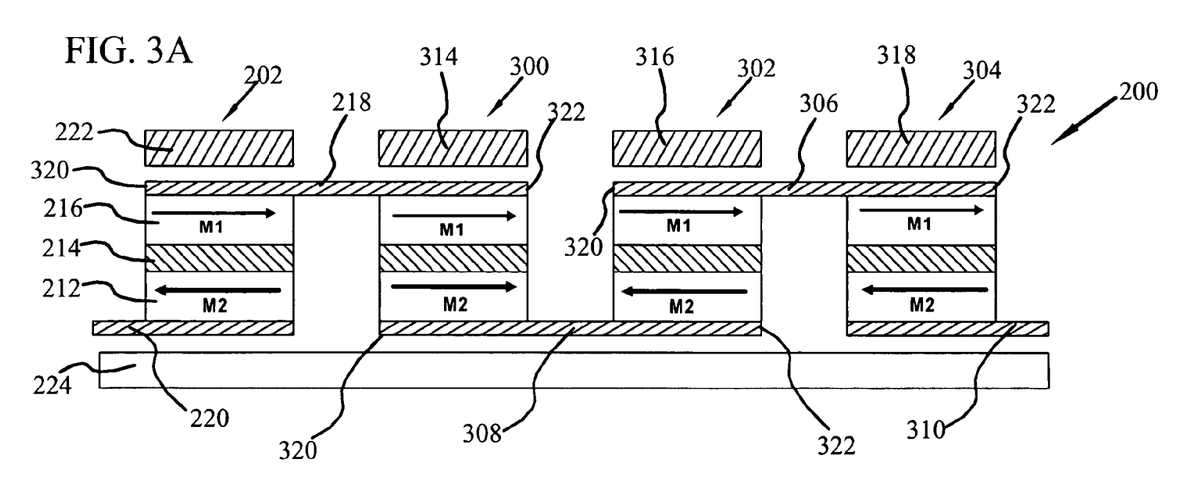
FIGS. 3A and 3B provide plain views of the memory according to FIGS. 2A and 2B.
Figure 3B:
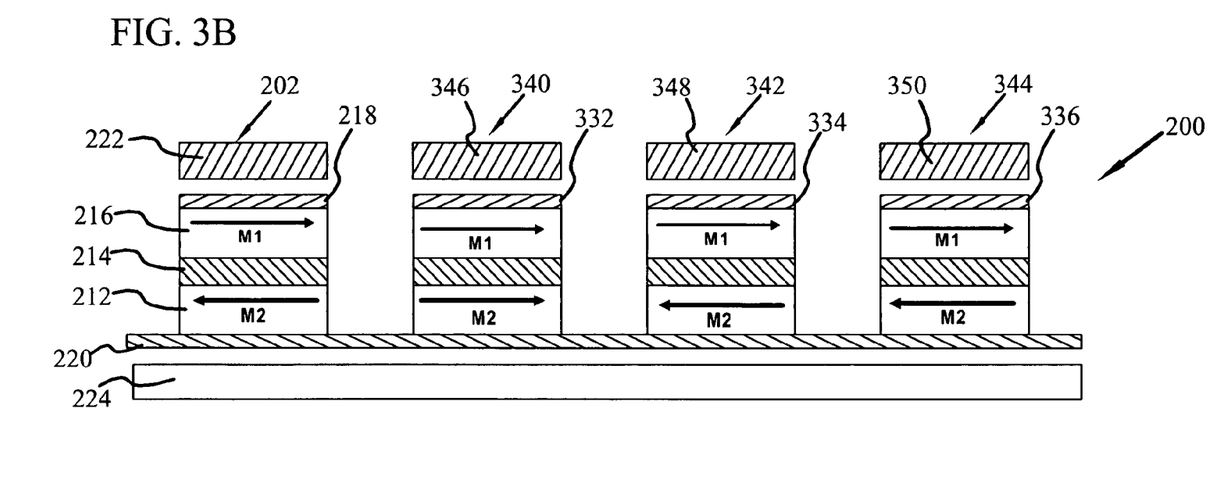

As shown in both FIGS. 3A and 3B, the electrical isolation of the write row conductor 222 and write column conductor 224 may be achieved by physical spacing. Under appropriate circumstances, such isolation may be achieved with the use of a material such as a dielectric.

FIG. 3A conceptually illustrates a larger portion of magnetic memory 200 wherein the MTJ cells 202, 300, 302, and 304 are connected in series by a plurality of first sense conductors (218, 306) and a plurality second sense conductors (220, 308, 310). As shown a plurality of parallel electrically conductive write row conductors 222, 314, 316, and 318 are located substantially proximate to and electrically isolated from the first sense conductors 218 and 306.

A plurality of parallel electrically conductive write columns 224 cross the write rows 222, 314, 316, and 318 are substantially proximate to and electrically isolated from the second sense conductors 220, 308 and 310. More specifically, in at least one embodiment the write row 222 is transverse to the write column 224. Accordingly, the write columns and rows form a write cross point array with a plurality of intersections. As FIG. 3A is a plain side view, only write column conductor 224 is shown.

When arranged in series, the first and second sense conductors are substantially thin and may have a length of just over twice the width of the MTJ cell 202. In at least one embodiment the first and second sense conductors are fabricated from Tantalum. Each sense conductor may be described as having a head 320 and a tail 322. The first and second sense conductors are vertically aligned and horizontally spaced so that head 320 of first sense conductor 306 overlaps the tail 322 of second sense conductor 308.

Likewise, the tail 322 of first sense conductor 218 overlaps the head 320 of second sense conductor 308. The plurality of MTJ cells are placed accordingly, one cell at each point of head and tail overlap. The placement of each soft-reference MTJ cell is also substantially in alignment with the intersections of the write cross point array.

Figure 4:
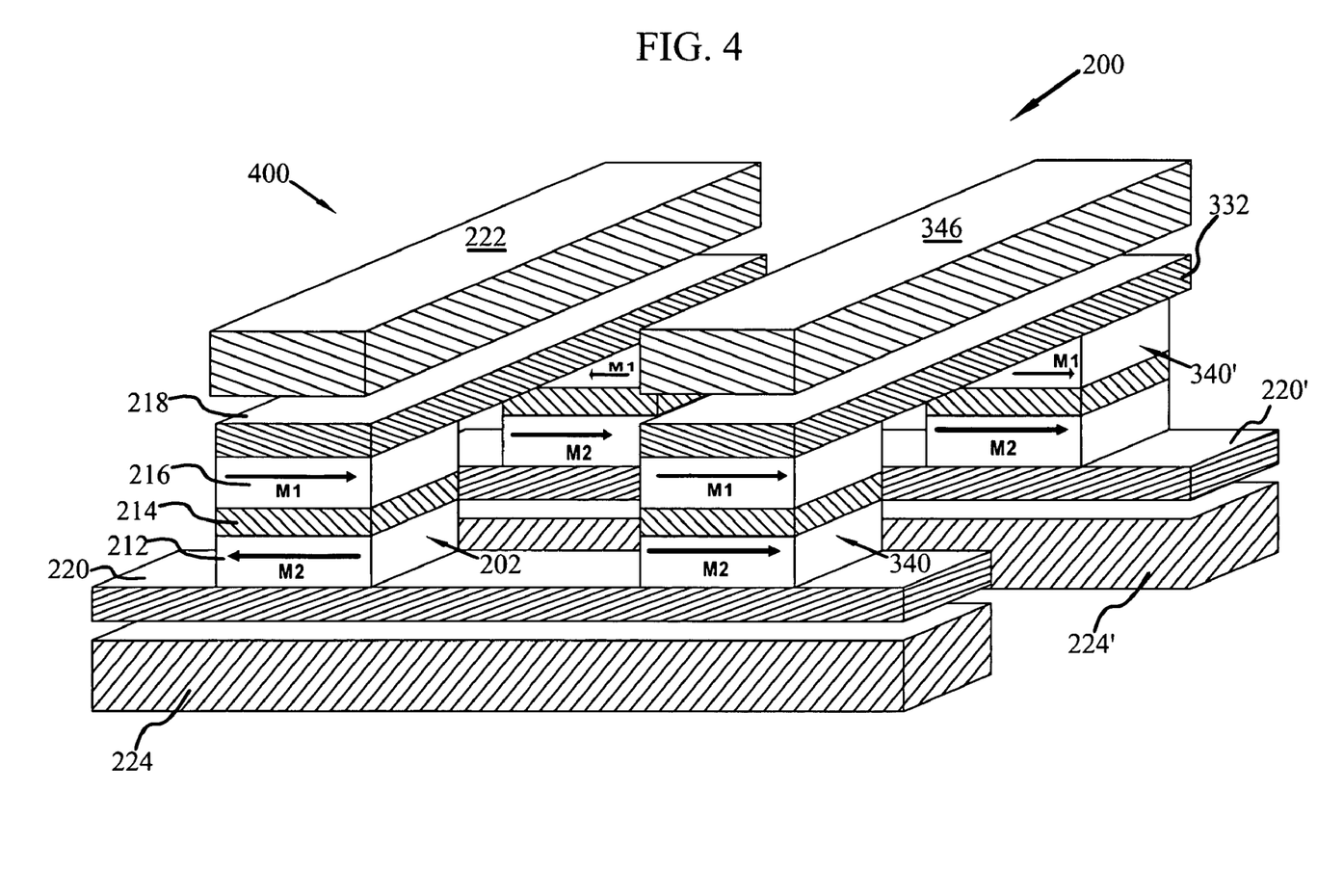
FIG. 4 is a partial perspective view of the cross point array of the memory of FIG. 3B.

FIG. 3B conceptually illustrates a larger portion of magnetic memory 200 wherein the plurality of MTJ cells 202, 340, 342, and 344 are arranged in a cross point array (see FIG. 4). As shown, the cross point array 400 includes a plurality of parallel electrically conductive first sense conductors 218, 332, 334, and 336. A plurality of electrically conductive second sense conductors 220 are located below and cross the first sense conductors, thereby forming a sense cross point array with a plurality of intersections. In at least one embodiment the second sense conductors 220 are transverse to the first sense conductors 218, 332, 334, and 336. A plurality of soft-reference MTJ cells 202, 340, 342, and 344 are provided. Respectively, each cell is in electrical contact with, and located at, an intersection between a given first sense conductor and a given second sense conductor.

A plurality of electrically conductive write rows 222, 346, 348, and 350 are located substantially proximate to and electrically isolated from the first sense conductors 218, 332, 334, and 336. A plurality of electrically conductive write columns 224 are located substantially proximate to and electrically isolated from the second sense conductors 220. In addition, the write columns are substantially transverse to the write rows, thereby forming a write cross point array with a plurality of intersections. The placement of each soft-reference MTJ cell 202, 340, 342, and 344 is substantially in alignment with the intersections of the write cross point array.

FIG. 4 provides a partial perspective view of the sense and write cross point architecture illustrated in FIG. 3B. The component structures of MTJ 340 and 340' parallel those of MTJ 202. As shown, the first sense conductors 218 and 332 are substantially parallel to the write row conductors 222 and 346, and second sense conductors 220 and 220' are substantially parallel to write column conductors 224 and 224'. It is to be understood that this arrangement has been provided for ease of conceptual illustration, and under appropriate circumstances these parallel relationships may not be employed. In addition, the conventions of first and second sense conductors and write row and write column conductors have been chosen for ease of the discussion herein.

The phenomenon that causes the resistance in the MTJ 202 is well understood in the magnetic memory art and is well understood for TMR memory cells. GMR and CMR memory cells have similar magnetic behavior but their magneto-resistance arises from different physical effects as the electrical conduction mechanisms are different. For instance, in a TMR-based memory cell, the phenomenon is referred to as quantum-mechanical tunneling or spin-dependent tunneling. In a TMR memory cell, the intermediate layer 214 is a thin barrier of dielectric material through which electrons quantum mechanically tunnel between the data layer 212 and the soft-reference layer 216.

In a GMR memory cell, the intermediate layer 214 is a thin spacer layer of non-magnetic but conducting material. Here the conduction is a spin-dependent scattering of electrons passing between the data layer 212 and the soft-reference layer 216 though the intermediate layer 214. In either case, the resistance between the data layer 212 and the soft-reference layer 216 will increase or decrease depending on the relative orientations of the magnetic fields M1 and M2. It is that difference in resistance that is sensed to determine if the data layer 212 is storing a logic state of "0" or a logic state of "1".

In at least one embodiment, the intermediate layer 214 is a tunnel layer made from an electrically insulating material (a dielectric) that separates and electrically isolates the data layer 212 from the soft-reference layer 216. Suitable dielectric materials for the dielectric intermediate layer 214 may include, but are not limited to: Silicon Oxide ($SiO_2$), Magnesium Oxide (MgO), Silicon Nitride ($SiN_x$), Aluminum Oxide ($Al_2O_3$), Aluminum Nitride ($AlN_x$), and Tantalum Oxide ($TaO_x$).

In at least one other embodiment, the intermediate layer 214 is a tunnel layer made from a non-magnetic material such as a 3d, a 4d, or a 5d transition metal listed in the periodic table of the elements. Suitable non-magnetic materials for a non-magnetic intermediate layer 214 may include, but are not limited to: Copper (Cu), Gold (Au) and Silver (Ag). While the actual thickness of the intermediate layer 214 is dependent upon the materials selected to create the intermediate layer 214 and the type of tunnel memory cell desired, in general, the intermediate layer 214 may have a thickness of about 0.5 nm to about 5.0 nm.

As noted above, the soft-reference layer 216 is so named because the direction of orientation of magnetization M1 can be dynamically set to a known direction. Such dynamic setting may be achieved by a magnetic field or fields provided by an externally supplied current flowing through at least one sense conductor. Under appropriate circumstances such as, for example, the series arrangement depicted in FIG. 3A, the dynamic setting may be achieved by a magnetic field or fields provided by an externally supplied current flowing through at least one write conductor.

The use of a soft-reference layer has several advantageous benefits in the MTJ 202. As a soft-reference layer is not substantially fixed in orientation, it may not be necessary to subject the MTJ 202 to high temperatures during manufacturing, as is often required to establish a fixed reference layer. In addition, the lack of a substantial and constant magnetic field in the reference layer reduces the likelihood of a demagnetization field from the reference layer acting upon the data layer, thus reducing the offset in the coercive switching field.

The use of four conductors, grouped as two for sensing and two for writing, provides several advantages over the prior art. The write operation is dependent upon a sufficient magnetic switching field being provided to overcome the coercivity of the data layer 212 and orient its magnetization M2 in a desired direction. This operation is not dependent upon the flow of current through the MTJ cell 202.

As the write row and column conductors 222, 224 are electrically isolated from the sense conductors, and thus by implication electrically insolated from the MTJ cell 202, a greater voltage may be applied to the write row and column conductors to cause a greater current to be applied to the write row and column conductors 222 and 224 then might otherwise be applied to the MTJ cell 202. Providing the switching field without requiring the MTJ cell 202 to endure the requisite high current reduces the likelihood of fatigue and or failure of the MTJ cell 202.

In addition, the use of a soft-reference layer within the four-conductor architecture permits the determination of the data bit stored in the data layer 212 without destructively over-writing and re-writing the data bit. As such a substantial opportunity for inadvertent data corruption is advantageously avoided.

More specifically, during a read operation the soft-ferromagnetic reference layer is pinned-on-the-fly to a desired orientation by a sense magnetic field generated by at least one sense current flowing in at least one sense conductor or one write conductor. This generated magnetic field is insufficient to affect the orientation of the data layer. In an alternative embodiment wherein the soft-reference layer 216 includes the first sense conductor 218 with ferromagnetic cladding 226, the sense magnetic field is substantially contained within the ferromagnetic cladding and is insufficient to affect the orientation of the data layer 212. In yet another alternative embodiment wherein the MTJ cells 202 are connected in series, during a read operation the ferromagnetic soft-reference layer is pinned-on-the-fly to a desired orientation by a sense magnetic field generated by at least one sense current flowing in at least one write conductor, the sense magnetic field being insufficient to affect the orientation of the data layer 212.

During a write operation a combined write magnetic field is generated by a write current flowing in the write row 222 and write column 224 conductors, the combined magnetic field is sufficient to orient the data layer 212. The affect of the field upon the soft-reference layer 216 is of substantially no concern, as its orientation M1 is not fixed and will respond again when an appropriate sense field is applied. Under appropriate circumstances, the write row 222 and write column 224 may be substantially coated with ferromagnetic cladding so as to minimize the spread of write magnetic fields.

Having described the above physical embodiment of the soft-reference four conductor magnetic memory 200, another embodiment relating to the method of use in non-destructively determining the value held in the data layer 212 will now be described with reference to FIGS. 5A–5B and 6A–6B illustrating a cross-point array, 7A–7B illustrating a series array, and the Flowchart of FIG. 8. It will be appreciated that the described method need not be performed in the order in which it is herein described, but that this description is merely exemplary of at least one method of using soft-reference four conductor magnetic memory 200, in accordance with the present invention. Except for the first "2" in the reference numerals used in the Figures above, the remainder of the numerals in FIGS. 5A~7B are similar to those used in other Figures to indicate similarity.

Figure 8:
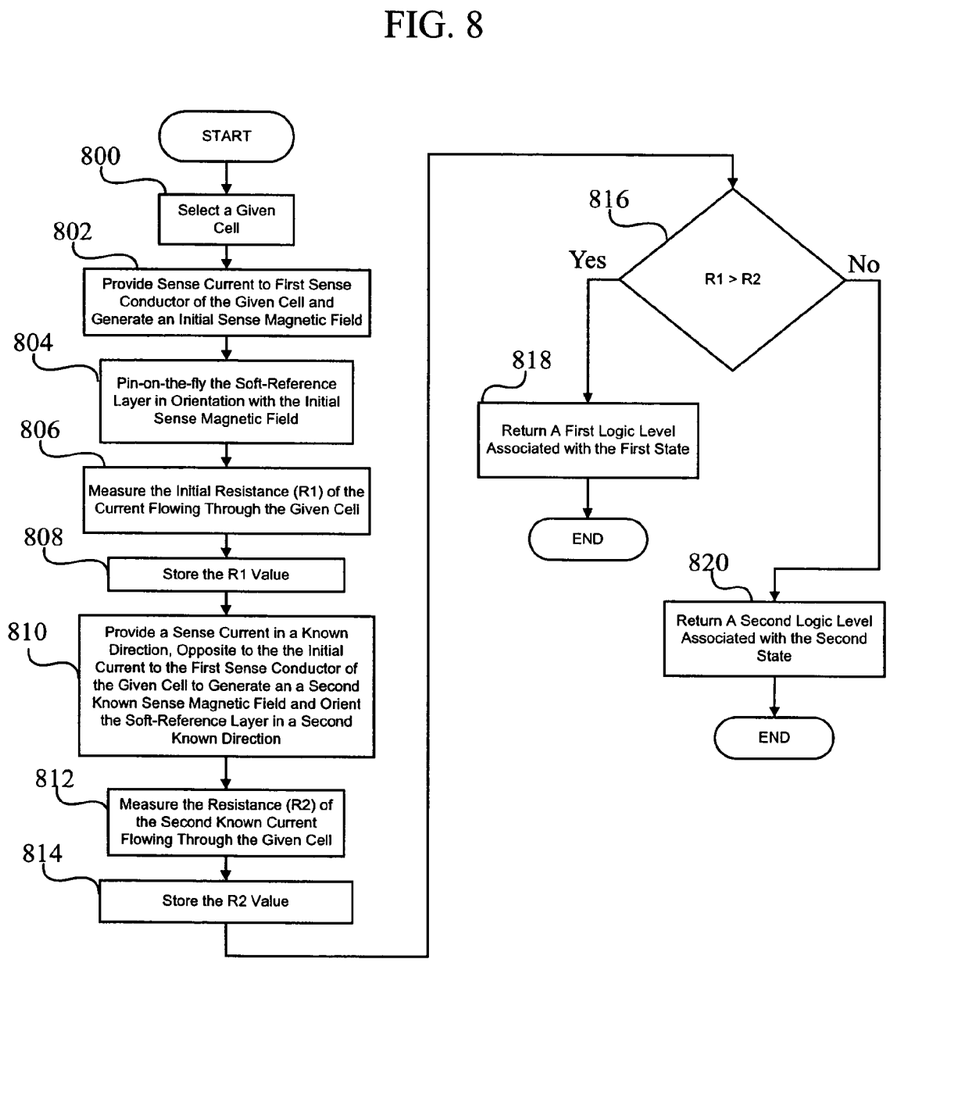
FIG. 8 is a flowchart depicting the steps of non-destructively sensing the data value within the memory according to FIGS. 2A and 2B.

As indicated in the flowchart of FIG. 8, the selection of a given magnetic memory cell is made in step 800 from a storage device having a plurality of soft-reference four conductor magnetic memory cells, each cell including a set of sense conductors in electrical contact with the cell and a set of write conductors electrically isolated form the cell.

Figure 5A:
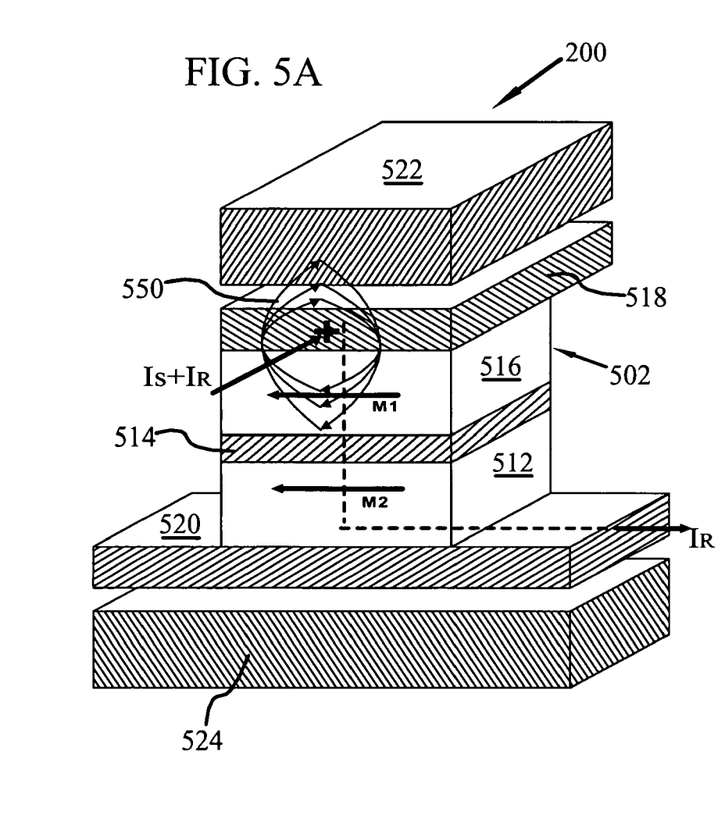
Figure 5B:
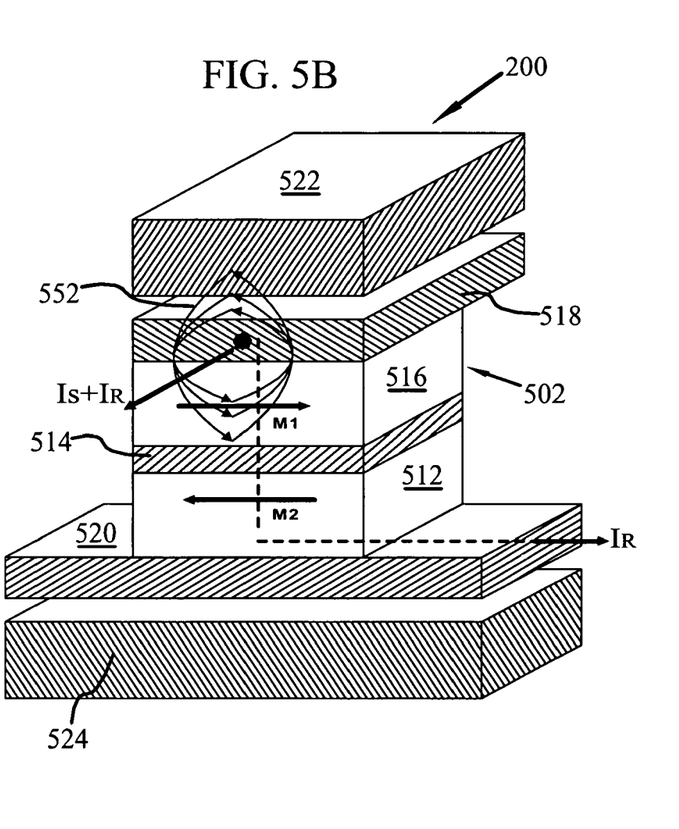

More specifically, FIGS. 5A and 5B conceptually illustrate the perspective view of a selected MTJ cell 502, substantially similar to memory cell 202 described above. MTJ cell 502 has at least one ferromagnetic data layer 512, an intermediate layer 514 and a ferromagnetic soft-reference layer 516. The ferromagnetic data layer 512 permits the storing of a bit of data as an alterable orientation of magnetization M2. The intermediate layer 514 has opposing sides such that the data layer 512 in contact with one side is in direct alignment with, and substantially uniformly spaced from, the soft-reference layer 516, in contact with the second side of the intermediate layer 514. The soft-reference layer 516 is characterized by a non-pinned orientation of magnetization M1 and a lower coercivity than the data layer 512.

The perspective cross section as shown illustrates the soft-reference four conductor magnetic memory 200 in a cross point architecture. The first sense conductor 518 is in electrical contact with the soft-reference layer 516, and is substantially transverse to the second sense conductor 520 in electrical contact with the data layer 512. The write row conductor 522 is substantially proximate to, and electrically isolated from, the first sense conductor 518. The write column conductor 524 is likewise substantially proximate to and electrically isolated from the second sense conductor 520.

In a relaxed state, where no current is applied, i.e. the magnitude of the current is substantially about zero, the orientation M1 of the soft-reference layer 516 will be anti-parallel to the orientation M2 of the data layer 512. This is due to the principles of magnetic coupling. Simply stated, the North pole of a magnetic is attracted to the South pole of another magnet, and vis-a-versa. As the soft-reference layer 516 has no fixed orientation, when no other magnetic fields are present and over-riding, it will align itself to be opposite to the data layer 512, thus providing its North pole South pole and South pole to North Pole. This anti-parallel relaxed state orientation is unaffected by the MTJ cell 502 being placed in a series array or cross-pint array.

With a cross-point array, in operation 802 an initial sense current is provided. More specifically, the initial sense current may be described as having at least two components—Is which serves to generate the magnetic field and orient the soft-reference layer, and $I_R$ which passes through the MTJ cell 502 and permits the measurement of resistance. In at least one embodiment, the initial sense current has a substantially low $I_S$ component. As such, the $I_R$ component permits the resistance to be measured while M2 is substantially in it's relaxed, natural, anti-parallel state with respect to M1.

The resistance of the MTJ cell 502 measured and recorded as "R1" indicated in blocks 806 and 808. The initial sense current provided may be applied in an arbitrary direction that is not immediately known. It is therefore generally beneficial to provide a reference for comparison, and a local reference is preferred. Such a reference value may be advantageously obtained without disrupting the orientation M2 of the data layer 512, simply by applying the sense current in a Second Known Direction as indicated in block 810.

As indicated in blocks 812 and 814 the resistance value from the Second Known Direction (the second resistance, R2) is measured and recorded as a reference resistance. As shown in FIG. 5A the sense current $I_S+I_R$ is flowing into the page, indicated by the "+" symbol, such that the magnetic field (represented by curved arrows 550) has a vector in the clockwise direction in accordance with the right-hand rule.

The orientation M1 of soft-reference layer 516 is therefore pinned-on-the-fly towards the left. The magnetic field 550 is by design quite small, and insufficient to affect the orientation M2 of the data layer 512.

With a reference resistance now known, the initial resistance may be compared. As illustrated in decision block 816, if the initial resistance is different from the reference resistance (R1>R2), a first logic level associated with this first state is returned, block 818. If the initial resistance is not different (R1=R2), then a second logic level associated with this second state is returned, block 820.

Figure 7A:
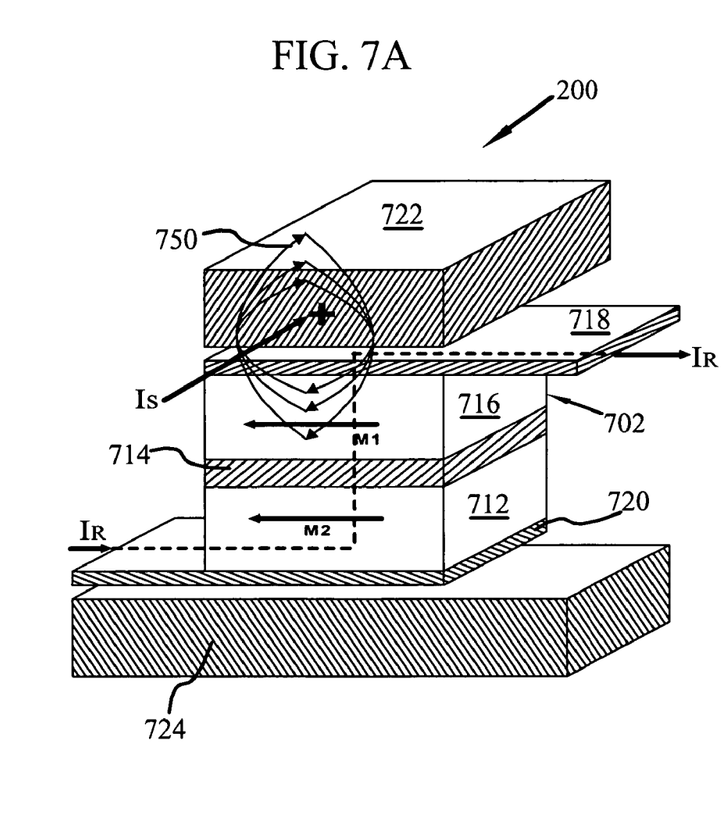
Figure 7B:
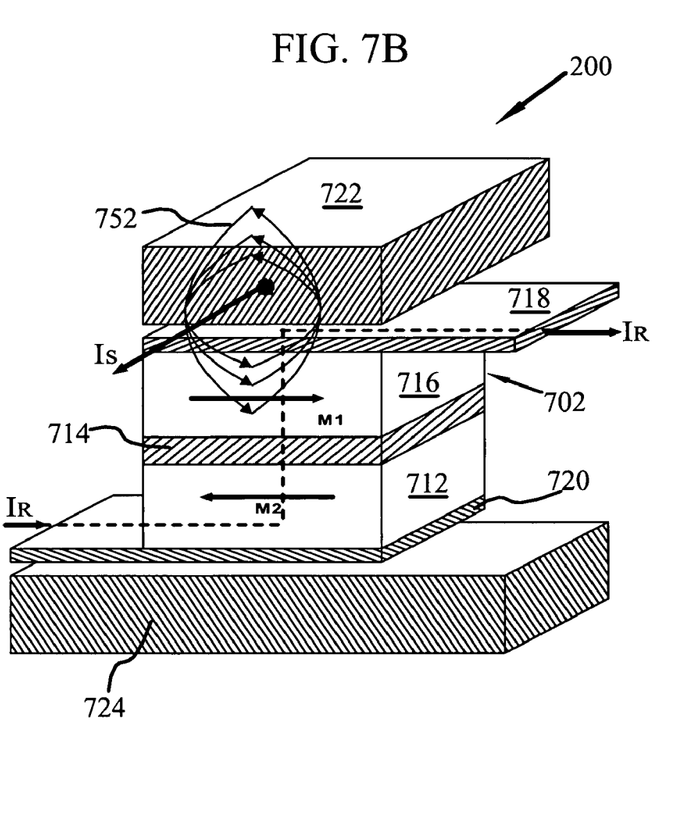

Under appropriate circumstances, such as where the MTJ cell 702 is connected in series, as shown in FIGS. 7A and 7B, or when deemed appropriate in cross-point arrays, a slightly different approach in sensing the data value of the cell may be taken. Briefly stated, the soft-reference layer is pinned-on-the-fly in two known directions with the resistance being measured for each. The measured resistance values are then compared to determine the orientation of M2 in the data layer.

For example, and with respect to FIGS. 7A and 7B, an initial current $I_S$ is applied in a First Known Direction to the write row conductor 722. As shown in FIG. 7A the sense current $I_S$ is flowing into the page, indicated by the "+" symbol, such that the magnetic field (represented by curved arrows 750) has a vector in the clockwise direction in accordance with the right-hand rule. The orientation of M1 of the soft-reference layer 716 is therefore pinned-on-the-fly towards the left. The magnetic field 750 is by design quite small, and insufficient to affect the orientation M2 of the data layer 712.

As the write row conductor 722 is electrically isolated from the MTJ cell 702 by intention, a separate initial current $I_R$ is applied to the second sense conductor 720. The resistance from the First Known Sense Current (the first resistance, R1) is then is measured and recorded as a reference resistance.

As shown in FIG. 7B, a current $I_S$ is then applied to write row conductor 722 in a Second Known Direction. As shown in FIG. 7B the sense current $I_S$ is flowing out of page, indicated by the "•" symbol, such that the magnetic field (represented by curved arrows 752) has a vector in the counter-clockwise direction in accordance with the right-hand rule. The orientation M1 of soft-reference layer 716 is therefore pinned-on-the-fly towards the right. As before, the magnetic field 752 is by design quite small, and insufficient to affect the orientation M2 of the data layer 712.

The resistance of the Second Known Sense Current (the second resistance, R2) is measured and recorded. With R2 now known, the values of R1 and R2 may be compared, decision 816. If the initial resistance is greater than the second resistance (R1>R2), a first logic level associated with this first state is returned, block 818. If the initial resistance is less than the second resistance (R1<R2), then a second logic level associated with this second state is returned, block 820. For either method, it is appreciated that where R1 is greater than R2, a first logic level associated with the first state is returned, thus under appropriate circumstances, the method may be simplified to test for this condition.

Figure 6A:
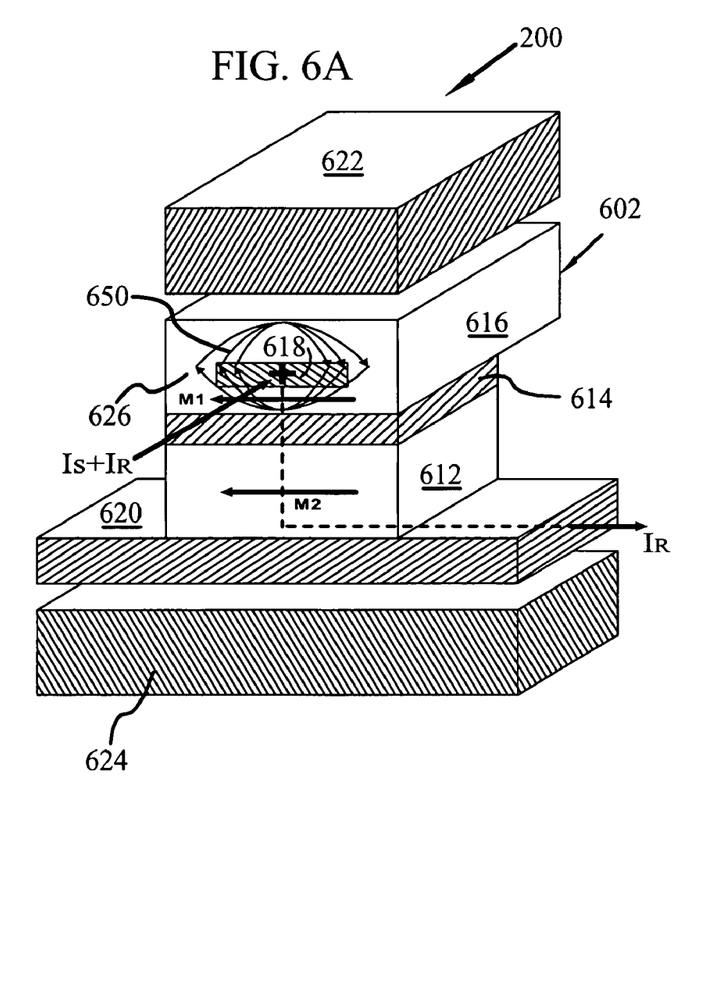
Figure 6B:
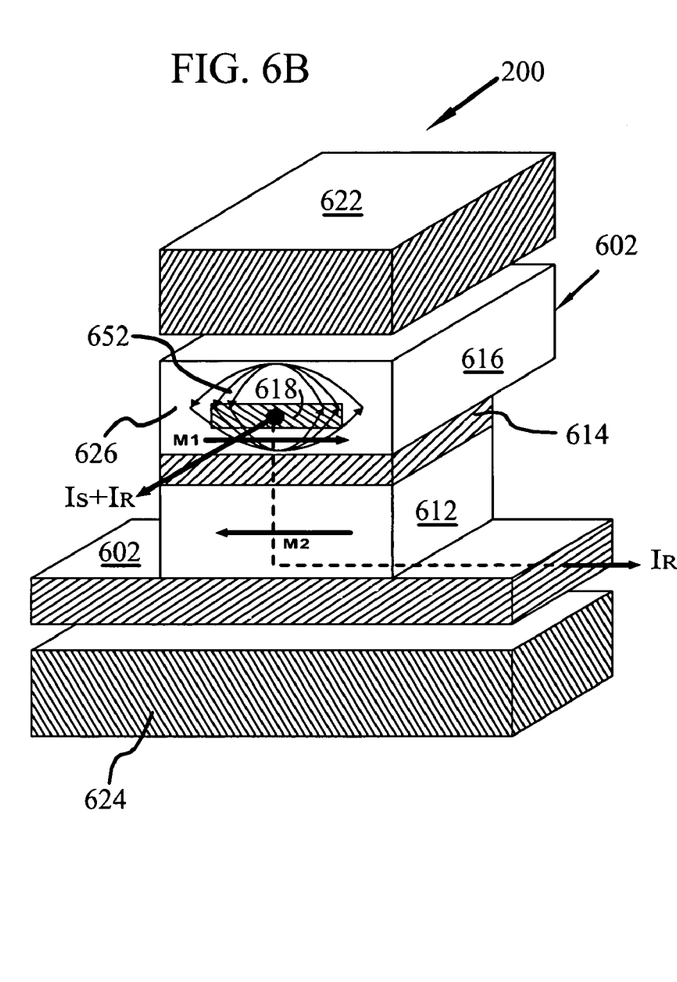

It is appreciated that this process may be applied in a cross-point array such as illustrated in FIGS. 5A–5B and 6A–6B. As described above, in at least one embodiment, the initial current $I_S+I_R$ is applied with a magnitude insufficient to provide magnetic fields 550 or 650. In an alternative embodiment, the initial current is applied in a First Known Direction and with a sufficient magnitude to produce a magnetic field 550, 560 and pin-on-the-fly the orientation M1 of the soft-reference layer 516, 616. As shown in FIGS. 5A and 6A the current $I_S+I_R$ is flowing into the page, indicated by the "+" symbol. The initial resistance is measured as R1. A Second Known Sense Current is then applied in a Second Known Direction and the second resistance, R2 is measured and recorded. As shown in FIGS. 5B and 6B the current $I_S+I_R$ is flowing out of the page, indicated by the "•" symbol. The comparison of R1 to R2 is again a greater than, less than comparison.

It is understood and appreciated that a convention will be adopted such as, for example, a logic state of "1" exists where M1 and M2 are anti-parallel (high resistance) in a first state, and a logic state of "0" exists where M1 and M2 are parallel (low resistance) in a second state. It is important to note that the sensing of the initial resistance (the first resistance) may be performed repeatedly, and averaged. So too may the sensing of the second resistance performed repeatedly, as it is well known and appreciated that with greater sampling there is a reduction in arbitrary error.

The partial cross section perspective view provided in FIGS. 6A and 6B strongly parallels the above discussion of FIGS. 5A and 5B, having an intermediate layer 614, a data layer 612, an electrically isolated write row conductor 622, and an electrically isolated write column conductor 624. The point of distinction is found in the soft-reference layer 616 of MTJ 602. Here, MTJ 602 is characterized by the clad first sense conductor 618. As shown, the ferromagnetic cladding 626 effectively contains the magnetic fields 650 and 652 substantially within the soft-reference layer 616.

The partial cross section perspective view provided in FIGS. 7A and 7B is similar as well to FIGS. 5A and 5B, having an intermediate layer 714, a data layer 712, an electrically isolated write row conductor 722, and an electrically isolated write column conductor 724. This alternative embodiment demonstrates the MTJ cell 702 as it would appear when connected in series.

More specifically, the first and second sense conductors 718 and 720 are substantially thinner than are the first and second sense conductors 518 and 520. As such the sense magnetic fields (represented by arrows 750 and 752) are provided by a read current being passed through the write row conductor 722. The direction of the magnetic field 750 or 752, and subsequent orientation M1 of the soft-reference layer 716 is substantially dependent upon the direction of the read current flowing in the write row conductor 722. The measurement of the resistance is performed by applying the sense current to MTJ cell 702 by the first and second sense conductors 718 and 720.

As multiple MTJ cells may be connected in series, it is understood and appreciated that the resistance measured will be a collective resistance for all MTJ cells in the series. However, because only a given MTJ cell 702 will be affected by the sense magnetic fields 750 and or 752, the change in resistance of the given cell 702 will affect the measured resistance for the series as a whole.

As the orientation M1 of the soft-reference layer (516, 616 and 716) is being altered in the sense process and not the orientation M2 of the data layer (512, 612 and 712) a disruption in the read/sense process is substantially unlikely to result in data corruption, as the data layer is not subjected to any write or re-write operation as is common in the prior art. This non-disruptive sensing ability is most advantageous.

For each of these embodiments, a write operation upon the data layer (512, 612 or 712) is achieved by combining externally provided magnetic fields generated by the write row and column conductors. It is the combined magnetic field achieved at the corresponding cross point of the selected cell that is sufficient to overcome the coercivity of the data layer. As the uncombined field of either the write row or write column is insufficient to alter the orientation M2 of the data layer, the chance of half-select error is minimized.

Another embodiment may be appreciated to be a computer system incorporating the soft-reference four conductor magnetic memory 200. A computer with a main board, CPU and at lest one memory store comprised of an embodiment of the soft-reference four conductor magnetic memory 200 described above raises the advantages of the improved MTJ's 302 to a system level.

While the invention has been described with reference to the preferred embodiment, it will be understood by those skilled in the art that various alterations, changes and improvements may be made and equivalents may be substituted for the elements and steps thereof without departing from the scope of the present invention. In addition, many modifications may be made to adapt to a particular situation or material to the teachings of the invention without departing from the essential scope thereof. Such alterations, changes, modifications, and improvements, though not expressly described above, are nevertheless intended and implied to be within the scope and spirit of the invention. Therefore, it is intended that the invention not be limited to the particular embodiments disclosed as the best mode contemplated for carrying out this invention, but that the invention will include all embodiments falling within the scope of the appended claims.

We claim:

1. A soft-reference four conductor magnetic memory storage device comprising:
   a plurality of parallel electrically conductive first sense conductors;
   a plurality of parallel electrically conductive second sense conductors crossing the first sense conductors, thereby forming a sense cross point array with a plurality of intersections;
   a plurality of soft-reference magnetic tunnel junction memory cells, each cell in electrical contact with and located at an intersection between a first sense conductor and a second sense conductor, the memory cells comprising a material with an alterable orientation of magnetization;
   a plurality of parallel electrically conductive write rows substantially proximate to and electrically isolated from the first sense conductors; and
   a plurality of parallel electrically conductive write columns crossing the write rows, substantially proximate to and electrically isolated from the second sense conductors, thereby forming a write cross point array with a plurality of intersections.

2. The magnetic memory device of claim 1, wherein each memory cell includes;
   at least one ferromagnetic data layer characterized by an alterable orientation of magnetization;
   an intermediate layer in contact with the data layer; and
   at least one ferromagnetic soft-reference layer in contact with the intermediate layer, opposite from the data layer, the soft-reference layer having a non-pinned orientation of magnetization and lower coercivity than the data layer.

3. The magnetic memory device of claim 2, wherein during a read operation the ferromagnetic soft-reference layer is pinned-on-the-fly to a desired orientation by a sense magnetic field generated by at least one sense current flowing in at least one sense conductor, the magnetic field being insufficient to affect the orientation of the data layer; and
   wherein during a write operation a combined write magnetic field is generated by a write current flowing in the write column and row conductors, the combined magnetic field sufficient to orient the data layer.

4. The magnetic memory device of claim 3, wherein the sense current is flowing in at least one sense conductor.

5. The magnetic memory device of claim 2, wherein the first sense conductor has a ferromagnetic cladding that completely surrounds the first sense conductor.

6. The magnetic memory device of claim 5, wherein the ferromagnetic clad first sense conductor is the soft-reference layer.

7. The magnetic memory device of claim 6, wherein during a read operation the ferromagnetic soft-reference layer is pinned-on-the-fly to a desired orientation by a sense magnetic field generated by a sense current flowing in the first sense conductor, the magnetic field being substantially contained within the ferromagnetic cladding and insufficient to affect the orientation of the data layer; and
   wherein during a write operation a combined write magnetic field is generated by a write current flowing in the write column and row conductors, the combined magnetic field sufficient to orient the data layer.

8. The magnetic memory device of claim 2, wherein the at least one write conductor is substantially covered with ferromagnetic cladding.

9. A soft-reference four conductor magnetic memory storage device comprising:
   a plurality of soft-reference magnetic tunnel junction memory cells connected in series by a plurality of first sense conductors and a plurality second sense conductors; the memory cells comprising a material with an alterable orientation of magnetization;
   a plurality of parallel electrically conductive write rows substantially proximate to and electrically isolated from the first sense conductors; and
   a plurality of parallel electrically conductive write columns transverse to the write rows, substantially proximate to and electrically isolated from the second sense conductors, thereby forming a write cross point array with a plurality of intersections.

10. The magnetic memory device of claim 9, wherein each memory cell includes;
    at least one ferromagnetic data layer characterized by at an alterable orientation of magnetization;
    an intermediate layer in contact with the data layer; and
    at least one ferromagnetic soft-reference layer in contact with the intermediate layer, opposite from the data layer, the soft-reference layer having a non-pinned orientation of magnetization and lower coercivity than the data layer.

11. The magnetic memory device of claim 10, wherein during a read operation the ferromagnetic soft-reference layer is pinned-on-the-fly to a desired orientation by a sense magnetic field generated by at least one sense current flowing in at least one write conductor, the magnetic field being insufficient to affect the orientation of the data layer; and
    wherein during a write operation a combined write magnetic field is generated by a write current flowing in the write column and row conductors, the combined magnetic field sufficient to orient the data layer.

12. The magnetic memory device of claim 9, wherein the at least one write conductor is substantially covered with ferromagnetic cladding.

13. A soft-reference four conductor magnetic memory cell comprising:
   at least one ferromagnetic data layer characterized by an alterable orientation of magnetization;
   an intermediate layer in contact with the data layer;
   at least one ferromagnetic soft-reference layer in contact with the intermediate layer, opposite from the data layer, the soft-reference layer having a non-pinned orientation of magnetization and lower coercivity than the data layer;
   at least one first sense conductor in electrical contact with the soft-reference layer, opposite from the intermediate layer;
   at least one second sense conductor in electrical contact with the data layer, opposite from the intermediate layer;
   at least one write column conductor substantially proximate to and electrically isolated from the second sense conductor; and
   at least one write row conductor substantially proximate to and electrically isolated from the first sense conductor.

14. The magnetic memory device of claim 13, wherein during a read operation the ferromagnetic soft-reference layer is pinned-on-the-fly to a desired orientation by a sense magnetic field generated by at least one sense current flowing in at least one sense conductor, the magnetic field being insufficient to affect the orientation of the data layer; and
   wherein during a write operation a combined write magnetic field is generated by a write current flowing in the write column and row conductors, the combined magnetic field sufficient to orient the data layer.

15. The magnetic memory device of claim 13, wherein, wherein during a read operation the ferromagnetic soft-reference layer is pinned-on-the-fly to a desired orientation by a sense magnetic field generated by at least one sense current flowing in at least one write conductor, the magnetic field being insufficient to affect the orientation of the data layer; and
   wherein during a write operation a combined write magnetic field is generated by a write current flowing in the write column and row conductors, the combined magnetic field sufficient to orient the data layer.

16. The magnetic memory device of claim 13, wherein the first sense conductor is substantially transverse to the second sense conductor.

17. The magnetic memory device of claim 13, wherein the write row is substantially transverse to the write column.

18. The magnetic memory device of claim 13, wherein the at least one write conductor is substantially covered with ferromagnetic cladding.

19. A soft-reference four conductor magnetic memory cell comprising:
   at least one soft-reference layer having a non-pinned orientation of magnetization and including a first sense conductor and a ferromagnetic cladding that completely surrounds the first sense conductor;
   an intermediate layer in contact with the soft-reference layer;
   at least one ferromagnetic data layer characterized by an alterable orientation of magnetization in contact with the intermediate layer opposite from the soft-reference layer and having a higher coercivity than the soft-reference layer;
   at least one second sense conductor in contact with the data layer, opposite from the intermediate layer;
   at least one write column conductor substantially proximate to and electrically isolated from the second sense conductor; and
   at least one write row conductor substantially proximate to and electrically isolated from the soft-reference layer, opposite from the write column.

20. The magnetic memory device of claim 19, wherein during a read operation the ferromagnetic soft-reference layer is pinned-on-the-fly to a desired orientation by a sense magnetic field generated by at least one sense current flowing in at least one sense conductor, the magnetic field being substantially contained within the ferromagnetic cladding and insufficient to affect the orientation of the data layer; and
   wherein during a write operation a combined write magnetic field is generated by a write current flowing in the write column and row conductors, the combined magnetic field sufficient to orient the data layer.

21. The magnetic memory device of claim 19, wherein the first sense conductor is substantially transverse to the second sense conductor.

22. The magnetic memory device of claim 19, wherein the write row is substantially transverse to the write column.

23. The magnetic memory device of claim 19, wherein the at least one write conductor is substantially covered with ferromagnetic cladding.

24. A method of non-destructively determining a data value in a magnetic memory storage device having a plurality of soft-reference four conductor magnetic memory cells, each cell including a soft-reference layer, a set of sense conductors in electrical contact with the cell, and a set of write conductors electrically isolated from the cell, the method comprising:
   selecting a given magnetic memory cell;
   providing an initial sense current to at least one sense conductor;
   generating an initial sense magnetic field proximate to the given memory cell;
   pinning-on-the-fly the soft-reference layer in orientation with the initial sense magnetic field;
   measuring an initial resistance value of the given cell;
   storing the initial resistance value;
   generating a second known sense magnetic field proximate to the given memory cell and orienting the soft-reference layer in a second known orientation;
   measuring a second resistance value of the given cell with the soft-reference in the second known orientation;
   storing the second resistance value as a reference resistance;
   comparing the initial resistance value to the reference resistance value; and
   returning a logic level associated with the compared state.

25. The method of claim 24, wherein the sense magnetic fields are generated by current flowing in at least one sense conductor.

26. The method of claim 24, wherein the sense magnetic fields are generated by current flowing in at least one write conductor.

27. The method of claim 24, wherein the sense magnetic fields do not affect the orientation of the data layer.

28. The method of claim 24, wherein the sense current in the second known direction is opposite to the initial sense current.

29. The method of claim 24, wherein the method is repeated more than once.

30. The method of claim 24, wherein the magnitude of the initial sense current is substantially about zero.

31. A method of non-destructively determining a data value in a magnetic memory storage device having a plurality of soft-reference four conductor magnetic memory cells, each cell including at least one ferromagnetic data layer, an intermediate layer, at least one ferromagnetic soft-reference layer in contact with the intermediate layer opposite from the data layer, at least one first sense conductor in electrical contact with the soft-reference layer, at least one second sense conductor in electrical contact with the data layer, and at least one write column conductor substantially proximate to and electrically isolated from the second sense conductor; and at least one write row conductor substantially proximate to and electrically isolated from the first sense conductor, the method comprising:
   selecting a given magnetic memory cell;
   providing an initial sense current to the first sense conductor, the current generating an initial sense magnetic field;
   pinning-on-the-fly the soft-reference layer in orientation with the initial sense magnetic field;
   measuring an initial resistance value of the given cell;
   storing the initial resistance value;
   providing a sense current in a second known direction to the first sense conductor, the current generating a second known sense magnetic field and orienting the soft-reference layer in a second known orientation;
   measuring a resistance value of the given cell with the soft-reference layer in the second known orientation;
   storing the resistance value of the second known direction as a reference resistance;
   comparing the initial resistance value to the reference resistance value; and
   returning a logic level associated with the compared state.

32. The method of claim 31, wherein the sense magnetic fields do not affect the orientation of the data layer.

33. The method of claim 31, wherein the sense current in the first known direction is opposite to the initial sense current.

34. The method of claim 31, wherein the method is repeated more than once.

35. The method of claim 31, wherein the magnitude of the initial sense current is substantially about zero.

36. A method of non-destructively determining a data value in a magnetic memory storage device having a plurality of soft-reference four conductor magnetic memory cells, each cell including at least one ferromagnetic data layer, an intermediate layer, at least one ferromagnetic soft-reference layer in contact with the intermediate layer opposite from the data layer, at least one first sense conductor in electrical contact with the soft-reference layer, at least one second sense conductor in electrical contact with the data layer, and at least one write column conductor substantially proximate to and electrically isolated from the second sense conductor; and at least one write row conductor substantially proximate to and electrically isolated from the first sense conductor, the method comprising:
   selecting a given magnetic memory cell;
   providing an initial sense current to the first sense conductor;
   providing a first read current to the write row conductor, the current generating an initial sense magnetic field;
   pinning-on-the-fly the soft-reference layer in orientation with the initial sense magnetic field;
   measuring an initial resistance value of the given cell;
   storing the initial resistance value;
   providing a second read current in a second known direction to the write row conductor, the current generating a second known sense magnetic field and orienting the soft-reference layer in a second known orientation;
   measuring a resistance value of the given cell with the soft-reference layer in the second known orientation;
   storing the resistance value of the second known orientation as a reference resistance;
   comparing the initial resistance value to the reference resistance value; and
   returning a logic level associated with the compared state.

37. The method of claim 36, wherein the sense magnetic fields do not affect the orientation of the data layer.

38. The method of claim 36, wherein the second read current in the first known direction is opposite to the first read current.

39. The method of claim 36, wherein the method is repeated more than once.

40. The method of claim 36, wherein the magnitude of the initial sense current is substantially about zero.

41. A computer system comprising:
   a main board;
   at least one central processing unit (CPU) joined to the main board;
   at least one soft-reference four conductor magnetic memory storage device joined to the CPU by the main board; the soft-reference four conductor magnetic memory including:
      a plurality of parallel electrically conductive first sense conductors;
      a plurality of parallel electrically conductive second sense conductors transverse to the first sense conductors, thereby forming a sense cross point array with a plurality of intersections;
      a plurality of soft-reference magnetic tunnel junction memory cells, each cell in electrical contact with and located at an intersection between a first sense conductor and a second sense conductor, the memory cells comprising a material with an alterable orientation of magnetization and a soft-reference layer;
      a plurality of parallel electrically conductive write rows substantially proximate to and electrically isolated from the first sense conductors; and
      a plurality of parallel electrically conductive write columns transverse to the write rows, substantially proximate to and electrically isolated from the second sense conductors, thereby forming a write cross point array with a plurality of intersections.

42. The magnetic memory storage device of claim 41, wherein during a read operation the soft-reference layer of a given cell is pinned-on-the-fly to a desired orientation by a sense magnetic field generated by at least one sense current flowing in at least one conductor, the sense magnetic field being insufficient to affect the orientation of a data layer; and
   wherein during a write operation a combined write magnetic field is generated by a write current flowing in the electrically conductive write columns and rows, the combined magnetic field sufficient to orient the data layer.

* * * * *